(12) United States Patent
Jiang et al.

(10) Patent No.: US 11,556,193 B1
(45) Date of Patent: Jan. 17, 2023

(54) TOUCH DISPLAY DEVICE AND ELECTRONIC DEVICE

(71) Applicant: TPK Advanced Solutions Inc., Fujian (CN)

(72) Inventors: Jia-Ming Jiang, Putian (CN); Renyuan Yan, Yongtai County (CN); Zhijuan Lin, Longhai (CN); Ching-Kai Cho, Changhua County (TW)

(73) Assignee: TPK Advanced Solutions Inc., Fujian (CN)

( * ) Notice: Subject to any disclaimer, the term of this patent is extended or adjusted under 35 U.S.C. 154(b) by 0 days.

(21) Appl. No.: 17/365,071

(22) Filed: Jul. 1, 2021

(51) Int. Cl.
*G06F 3/041* (2006.01)
*H01L 27/32* (2006.01)

(52) U.S. Cl.
CPC ............ *G06F 3/041* (2013.01); *H01L 27/323* (2013.01)

(58) Field of Classification Search
CPC ....................................................... G06F 3/041
See application file for complete search history.

(56) References Cited

U.S. PATENT DOCUMENTS

| | | | |
|---|---|---|---|
| 2018/0181250 A1* | 6/2018 | Kuo | G06F 3/0412 |
| 2020/0057545 A1* | 2/2020 | Seomoon | G06F 3/04142 |
| 2020/0137899 A1* | 4/2020 | Lin | G02F 1/133528 |
| 2021/0081065 A1* | 3/2021 | Hsiao | H05K 1/189 |

FOREIGN PATENT DOCUMENTS

CN 208335148 U * 1/2019 ............. G06F 3/041

* cited by examiner

*Primary Examiner* — Towfiq Elahi
(74) *Attorney, Agent, or Firm* — Cooper Legal Group, LLC

(57) ABSTRACT

A touch display device is provided in some embodiments of the present disclosure, including a cover plate, a touch sensing film, and a display module. The touch sensing film is disposed on the cover plate, and the touch sensing film includes a first surface and a second surface opposite to the first surface. The touch sensing film is bended from outside to inside, so that the first surface or the second surface is folded to define an overlapping region and a non-overlapping region.

20 Claims, 6 Drawing Sheets

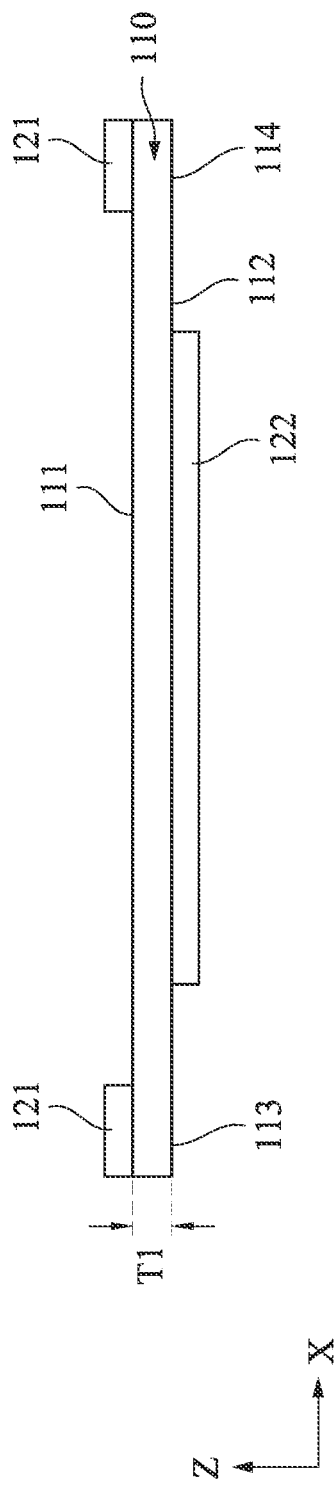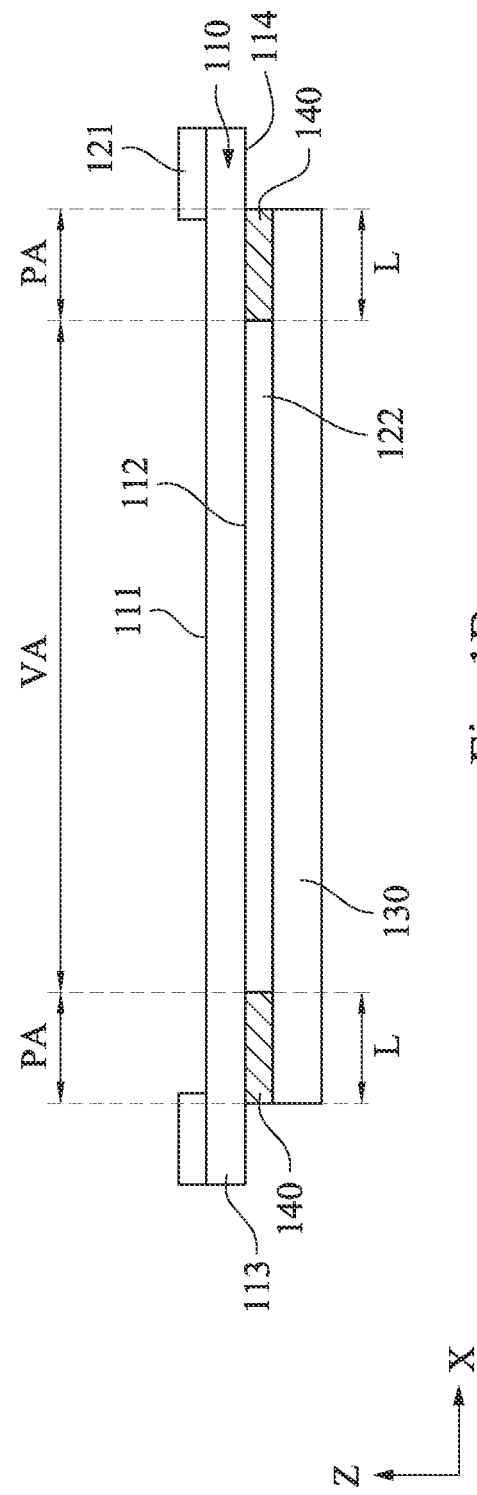
Fig. 1A
Fig. 1B

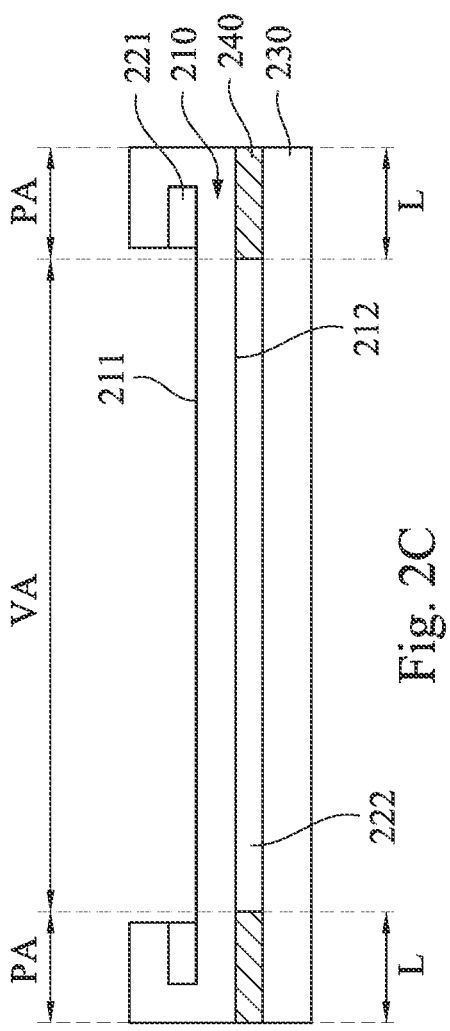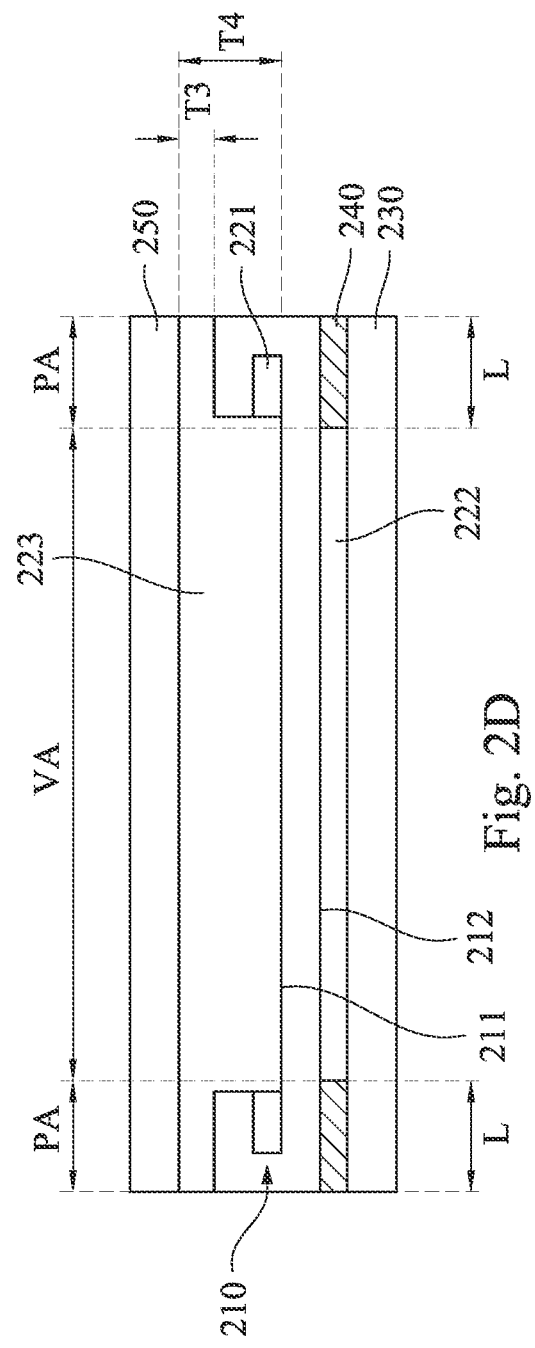

TOUCH DISPLAY DEVICE AND ELECTRONIC DEVICE

BACKGROUND

Field of Disclosure

The present disclosure relates to a touch display device and an electronic device.

Description of Related Art

With the vigorous development of touch display device technologies in recent years, touch display devices have been widely used in various electronic devices. Generally, in an electronic device including a touch display device, in order to prevent users from perceiving electrode wires in a peripheral area and affecting the visual perception, a light-shielding layer is utilized to shield the peripheral area, and an external bezel is provided to shield circuits in an internal non-visual area and to also protect internal elements.

In order to improve visual experience, how to reduce the range or extension length of the electrode wires in the peripheral area without affecting the design and performance of the electrode wires, thereby promoting the development of narrow bezels and full screens, really needs to be ameliorated in the existing technologies.

SUMMARY

The objective of one embodiment of the present disclosure is to provide a touch display device, including a cover plate, a touch sensing film, a display module, a first adhesive layer, a second adhesive layer, and a third adhesive layer. The touch sensing film is disposed on the cover plate. The touch sensing film includes a first surface and a second surface opposite to the first surface, and a direction between two opposite ends of the touch sensing film is defined as a first direction. A direction passing through the first surface and the second surface is defined as a second direction, and the second direction is perpendicular to the first direction. The two opposite ends of the touch sensing film are bent from outside to inside, so that the first surface or the second surface is folded to define an overlapping region and a non-overlapping region. The display module is disposed on the touch sensing film. A first adhesive layer adheres the first surface folded in the overlapping region, wherein a thickness of the first adhesive layer is 50 µm to 100 µm. A second adhesive layer adheres the cover plate and the touch sensing film. A third adhesive layer adheres the touch sensing film and the display module, wherein a thickness of the third adhesive layer is greater than or equal to twice the thickness of the first adhesive layer and less than or equal to five times the thickness of the first adhesive layer.

In some embodiments, the second adhesive layer adheres a light-shielding layer and the touch sensing film.

In some embodiments, a distance between the first surface and the second surface in the non-overlapping region of the touch sensing film along the second direction defines a first thickness, and the first thickness is T1. A distance between the overlapped second surface in the overlapping region along the second direction defines a second thickness, and the second thickness is T2. T1 is from 0.025 mm to 0.075 mm, and T2 is from 0.1 mm to 0.2 mm.

In some embodiments, a light-shielding layer is disposed between the cover plate and the touch sensing film, wherein a majority of the light-shielding layer is located in the overlapping region. A length of the light-shielding layer along the first direction is greater than a length of the overlapping region along the first direction so that a portion of the light-shielding layer is located in the non-overlapping region.

In some embodiments, the length of the light-shielding layer along the first direction is L, and L is from 1 mm to 2.5 mm.

In some embodiments, a surface of the touch sensing film adjacent to the cover plate has only the second surface, and a surface of the touch sensing film adjacent to the display module has both of a portion of the first surface and a portion of the second surface. A distance between the portion of the first surface and the portion of the second surface along the second direction defines a height difference that is H1, and H1 is greater than 0.

In some embodiments, a surface of the touch sensing film adjacent to the display module has only the second surface, and a surface of the touch sensing film adjacent to the cover plate has both of a portion of the first surface and a portion of the second surface. A distance between the portion of the first surface and the portion of the second surface along the second direction defines a height difference H2, and H2 is greater than 0.

In some embodiments, projection positions of the second adhesive layer and the first adhesive layer on the touch sensing film along the second direction do not overlap.

In some embodiments, projection positions of the second adhesive layer and the first adhesive layer on the touch sensing film along the second direction partially overlap.

In some embodiments, the second adhesive layer is coated on the second surface of the touch sensing film that overlaps the cover plate.

In some embodiments, a transmittance of the second adhesive layer and the third adhesive layer to visible light is at least 60%.

In some embodiments, the display module includes a light-guiding plate, and the light-guiding plate is disposed on the touch sensing film.

The other objective of one embodiment of the present disclosure is to provide an electronic device including the foregoing touch display device.

BRIEF DESCRIPTION OF THE DRAWINGS

The present disclosure can be more fully understood by reading the following detailed description of embodiments with reference to the accompanying drawings.

FIG. 1A to FIG. 1E are schematic diagrams exemplarily depicting various process stages of manufacturing a touch display device in some embodiments according to the present disclosure;

FIG. 2A to FIG. 2D are schematic cross-sectional views exemplarily depicting various process stages of manufacturing a touch display device in some other embodiments according to the present disclosure.

DESCRIPTION OF THE EMBODIMENTS

Figure 1C:
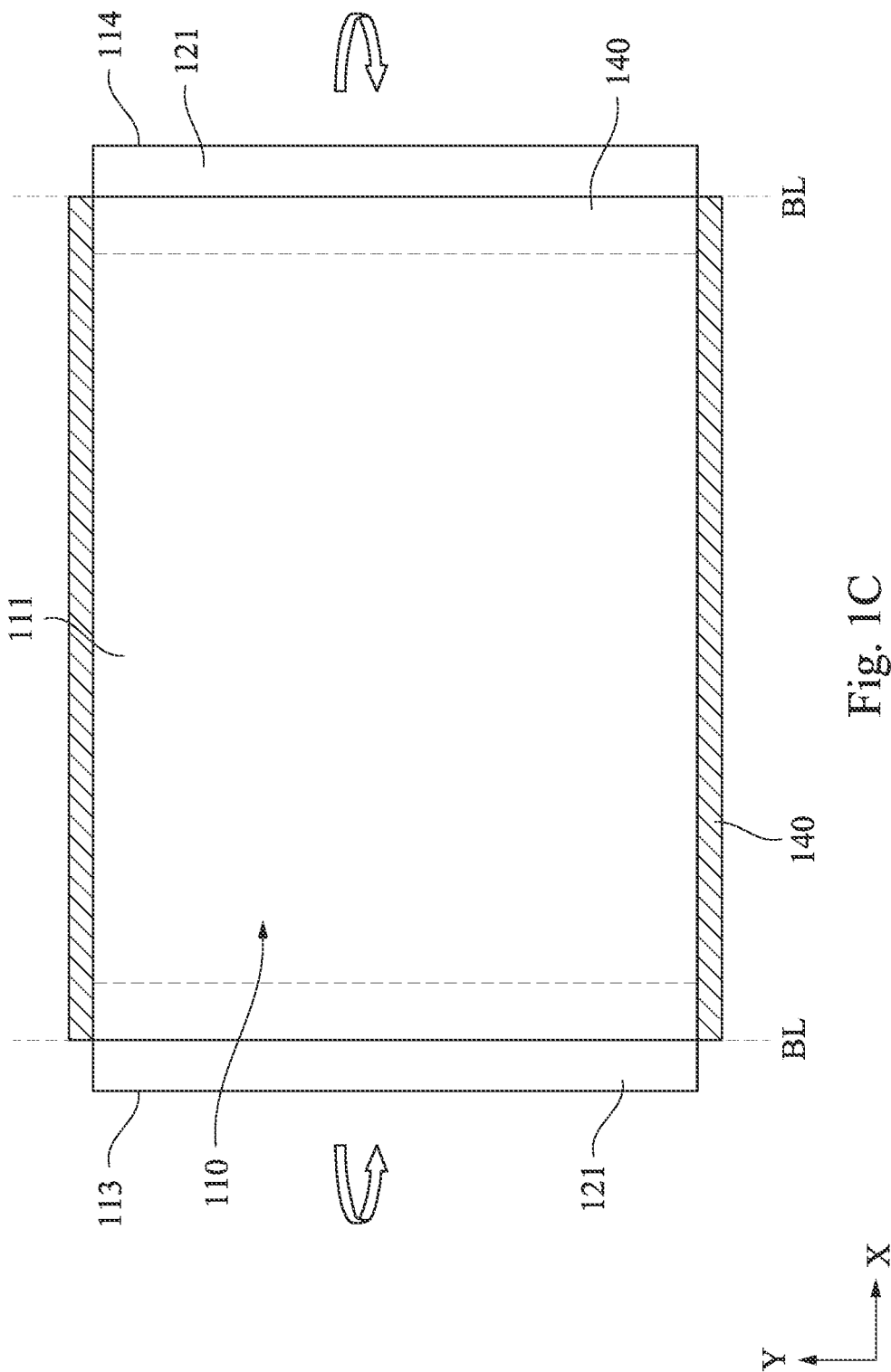

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. Any examples of the use of the term discussed herein included in the description of the present specification are merely for illustrative purposes and are not intended to limit the scope and meaning of the present disclosure or any exemplary term. Similarly, the present disclosure is not limited to the various embodiments described in this specification.

Further, spatially relative terms, such as "beneath," "below," "lower," "above," "upper", and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

As used herein, the singular forms "a", "an", and "the" are intended to include the plural forms as well, unless the context clearly indicates otherwise. It will be further understood that the terms "comprises" and/or "comprising", "includes" and/or "including", or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms "first," "second," etc., may be used herein to describe various elements, these elements should not be limited by these terms. These terms are used to distinguish one element from another. For example, a first element could be termed a second element, and similarly, a second element could be termed a first element, without departing from the scope of the embodiments.

It will be understood that, as used herein, the term "and/or" includes any and all combinations of one or more of the associated listed items.

Several embodiments are listed below to describe in more detail the touch display device of the present disclosure. However, the embodiments are only for illustrative purposes and are not used to limit the present disclosure. The scope of protection of the present disclosure should be defined by the appended claims.

FIG. 1A to FIG. 1E are schematic diagrams exemplarily depicting various process stages of manufacturing a touch display device 100 in some embodiments according to the present disclosure.

First, with reference to FIG. 1A, a touch sensing film 110, a first adhesive layer 121, and a second adhesive layer 122 are provided. The touch sensing film 110 includes a first surface 111 and a second surface 112 opposite to the first surface 111. A direction passing through the first surface 111 and the second surface 112 is defined as a second direction (such as, a Z-axis direction in FIG. 1A), and the second direction is perpendicular to a first direction (such as, an X-axis direction in FIG. 1A). The first adhesive layer 121 is disposed on the first surface 111 and is adjacent to or located at a peripheral portion of the touch sensing film 110. The second adhesive layer 122 is disposed below the second surface 112. In some embodiments, the first adhesive layer 121 is disposed on the first surface 111 and located on two opposite ends 113 and 114 of the touch sensing film 110. In some embodiments, the projection positions of the second adhesive layer 122 and the first adhesive layer 121 on the touch sensing film 110 between the two opposite ends 113 and 114 of the touch sensing film 110 along the second direction (such as, the Z-axis direction in FIG. 1A) do not overlap. In some other embodiments, the projection positions of the second adhesive layer 122 and the first adhesive layer 121 on the touch sensing film 110 along the second direction (such as, the Z-axis direction) partially overlap. In some embodiments, the second adhesive layer 122 may also be coated on the second surface 112 of the touch sensing film 110 that overlaps a cover plate 130.

In some embodiments, the touch sensing film 110 includes a plurality of electrode wires, and the electrode wires are flexible. In some embodiments, the flexible electrode wires can be formed of a transparent conductive material. The transparent conductive material includes, but is not limited to, nanosilver paste, nanosilver mixture, nanosilver polymer, or a combination thereof. In some embodiments, the electrode wires can be obtained through a photo-etching process.

In some embodiments, the distance between the first surface 111 and the second surface 112 of the touch sensing film 110 along the second direction (such as, the Z-axis direction) defines a first thickness T1. In some embodiments, the first thickness T1 is from 0.025 mm to 0.075 mm, such as, 0.025 mm, 0.03 mm, 0.035 mm, 0.04 mm, 0.045 mm, 0.05 mm, 0.055 mm, 0.06 mm, 0.065 mm, 0.07 mm, 0.075 mm, or the value of any interval in the foregoing point values.

In some embodiments, the adhesive material of the first adhesive layer 121 may be light-transmitting (such as a material with a transmittance of at least 60% to visible light (having a wavelength in the range of 400-750 nm), for example, the transmittance is 60%, 70%, 80%, 90%, or the value of any interval in the foregoing point values) or light-shielding (such as a material with a transmittance of at most 20% to visible light, for example, the transmittance is 5%, 10%, 15%, 20%, or the value of any interval in the foregoing point values). In an embodiment, the light-transmitting material of the first adhesive layer 121 may be an optical clear adhesive (OCA), biaxially-oriented polyethylene terephthalate (BoPET, also known as Mylar®), or polyethylene terephthalate (PET) with OCA.

In some embodiments, the thickness of the first adhesive layer 121 is less than 150 μm, for example, from 10 μm to 150 μm. In an embodiment, the thickness of the first adhesive layer 121 is 10 μm, 20 μm, 30 μm, 40 μm, 50 μm, 60 μm, 70 μm, 80 μm, 90 μm, 100 μm, 110 μm, 120 μm, 130 μm, 140 μm, 150 μm, or the value of any interval in the foregoing point values.

In some embodiments, the second adhesive layer 122 is made of a light-transmitting material. A person skilled in the art can flexibly select and adjust the material and the thickness of the second adhesive layer 122 according to the purpose of use. For example, a light-transmitting material and thickness that is the same as or similar to those of the first adhesive layer 121 can be selected.

With continuing reference to FIG. 1B, the cover plate 130 and a light-shielding layer 140 disposed on the cover plate 130 are provided. Next, the second adhesive layer 122 is used to adhere the cover plate 130 and the touch sensing film 110, so that the second adhesive layer 122 and the light-shielding layer 140 are located between the cover plate 130 and the touch sensing film 110. The region where the light-shielding layer 140 is projected on the cover plate 130 along the second direction (such as, the Z-axis direction) is a peripheral area PA, and the region of the cover plate 130 that is not covered by the light-shielding layer 140 is defined as a visible area VA (that is, the visible area VA is filled with the second adhesive layer 122). It should be noted that, in this structure, the length of the touch sensing film 110 along the first direction (such as, the X-axis direction) is greater than the length of the cover plate 130 along the first direction. In some embodiments, the two opposite ends 113 and 114 of the touch sensing film 110 extend beyond the length of the cover plate 130. In other embodiments, in addition to adhering to the cover plate 130 and the touch sensing film 110, the second adhesive layer 122 may further extend between the light-shielding layer 140 and the touch sensing film 110 to adhere the light-shielding layer 140 and the touch sensing film 110. That is, the second adhesive layer 122 is also disposed between the light-shielding layer 140 and the touch sensing film 110. In this case, the second adhesive layer 122 can make the adhesion between the light-shielding layer 140 and the touch sensing film 110 tighter, and the second adhesive layer 122 can also make the interface between the second adhesive layer 122 and the touch sensing film 110 less likely to generate bubbles.

In some embodiments, the cover plate 130 may be a transparent substrate, such as a transparent inorganic substrate (for example, a glass substrate) or a transparent organic substrate. The transparent organic substrate may be a plastic substrate, such as poly(methylmethacrylate) (PMMA), polyethylene (PE), polyvinyl chloride (PVC), polypropylene (PP), polyethylene terephthalate (PET), polyethylene naphthalate (PEN), polycarbonate (PC), polystyrene (PS), polyimide (PI), cyclo-olefin polymers (COP), or the like.

In some embodiments, the light-shielding layer 140 may be formed of opaque ink, such as black ink, white ink, and the like. In some embodiments, the length of the light-shielding layer 140 along the first direction (such as, the X-axis direction) defines a length L. The length L is from 1 mm to 2.5 mm, such as 1 mm, 1.1 mm, 1.2 mm, 1.3 mm, 1.4 mm, 1.5 mm, 1.6 mm, 1.7 mm, 1.8 mm, 1.9 mm, 2.0 mm, 2.1 mm, 2.2 mm, 2.3 mm, 2.4 mm, 2.5 mm, or the value of any interval of the foregoing point values. In some other embodiments, it is also possible to include a light-shielding portion, instead of the light-shielding layer 140, in the cover plate 130.

Figure 1D:
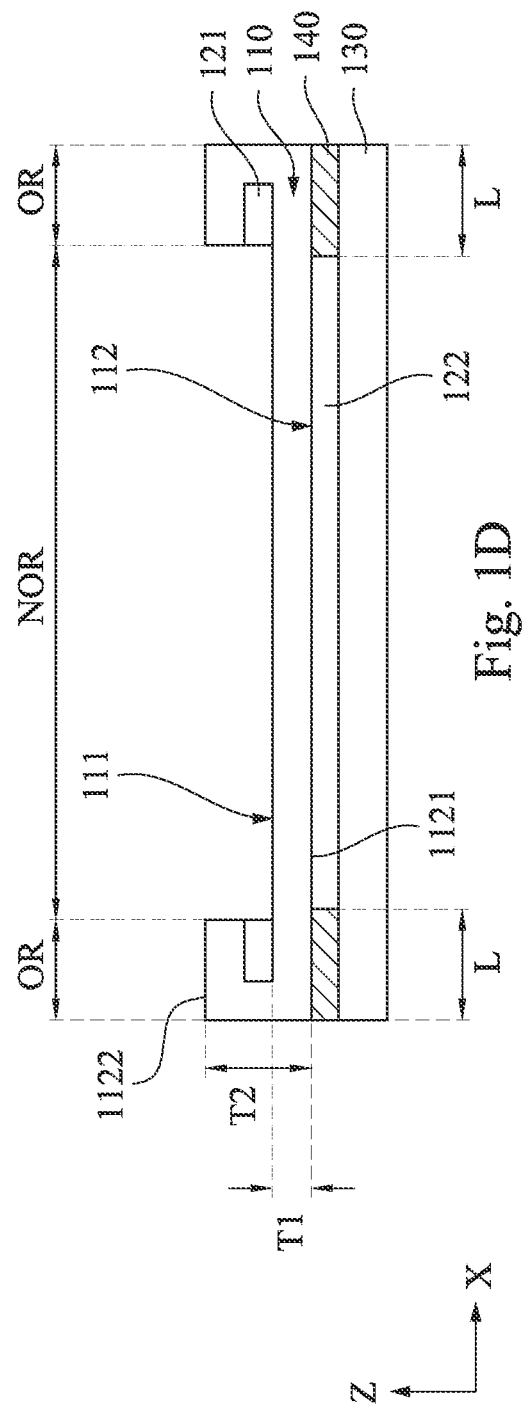

Next, with joint reference to FIG. 1C and FIG. 1D, FIG. 1C and FIG. 1D are schematic diagrams of the same step in different views, wherein FIG. 1C is a top view (a view in the X-axis and Y-axis directions), and FIG. 1D is a sectional view (a view in the X-axis and Z-axis directions). Exemplarily, the two opposite ends 113 and 114 of the touch sensing film 110 are bent upwards along a bend line BL from outside to inside, so that portions of the first surface 111 are superimposed on each other and are adhered by using the first adhesive layer 121, to define an overlapping region OR and a non-overlapping region NOR. In some embodiments, the bending is not limited to the two opposite ends 113 and 114, and it is also possible to bend any end of the touch sensing film 110 separately.

In some embodiments, the light-shielding layer 140 has two lengths L along the first direction (such as, the X-axis direction), and one of the lengths L is greater than the length of the overlapping region OR along the first direction (such as, the X-axis direction). Therefore, a majority of the light-shielding layer 140 is located in the overlapping region OR, while a portion of the light-shielding layer 140 is located in the non-overlapping region NOR. That is, the entire overlapping region OR is located within the range of the peripheral area PA (also referring to FIG. 1B). In this way, the overlapping region OR can be folded within the shielding range of the light-shielding layer 140 to prevent the overlapping region OR from affecting the visual effect.

In some embodiments, along the second direction (such as, the Z-axis direction), except for the lowermost portion 1121 of the second surface 112 in the overlapping region OR, the other portion 1122 of the second surface 112 is folded to the top. The distance between the uppermost second surface 112 (the other portion 1122) and the lowermost second surface 112 (the lowermost portion 1121) in the overlapping region OR along the second direction (such as, the Z-axis direction) defines a second thickness T2. In some embodiments, the second thickness T2 is from 0.1 mm to 0.2 mm, such as 0.1 mm, 0.11 mm, 0.12 mm, 0.13 mm, 0.14 mm, 0.15 mm, 0.16 mm, 0.17 mm, 0.18 mm, 0.19 mm, 0.2 mm, or the value of any interval in the foregoing point values. The thickness obtained by subtracting twice the first thickness T1 from the second thickness T2 is the thickness of the first adhesive layer 121. The thickness of the first adhesive layer 121 may be greater than or equal to 50 μm and less than or equal to 100 μm, i.e., $50\ \mu m \leq (T2-2T1) \leq 100\ \mu m$, such as, 50 μm, 60 μm, 70 μm, 80 μm, 90 μm, 100 μm, or the value of any of the foregoing intervals. When the thickness of the first adhesive layer 121 is less than 50 μm, it is easy to cause the bending degree of the touch sensing film 110 to be too large (i.e., the bending radius is too small). In this case, it is easy to cause a conductive line or an electrode pattern in the bending area to break, thus causing the touch to be ineffective. When the thickness of the first adhesive layer 121 is greater than 100 μm, a third adhesive layer 123 (also referring to FIG. 1E) needs to be thicker to effectively adhere the touch sensing film 110 and a display module 150, resulting in the overall thickness of the touch display device 100 being too large, which runs counter to the development trend of the touch display module of becoming lighter and thinner.

Furthermore, with reference to FIG. 1D, in some embodiments, in addition to adhering to the cover plate 130 and the touch sensing film 110, the second adhesive layer 122 may further extend between the light-shielding layer 140 and the touch sensing film 110 to adhere the light-shielding layer 140 and the touch sensing film 110. That is, the second adhesive layer 122 is also disposed between the light-shielding layer 140 and the touch sensing film 110. In this case, the second adhesive layer 122 can make the adhesion between the light-shielding layer 140 and the touch sensing film 110 tighter, and the second adhesive layer 122 can also make the interface between the second adhesive layer 122 and the touch sensing film 110 less likely to generate bubbles.

Figure 1E:
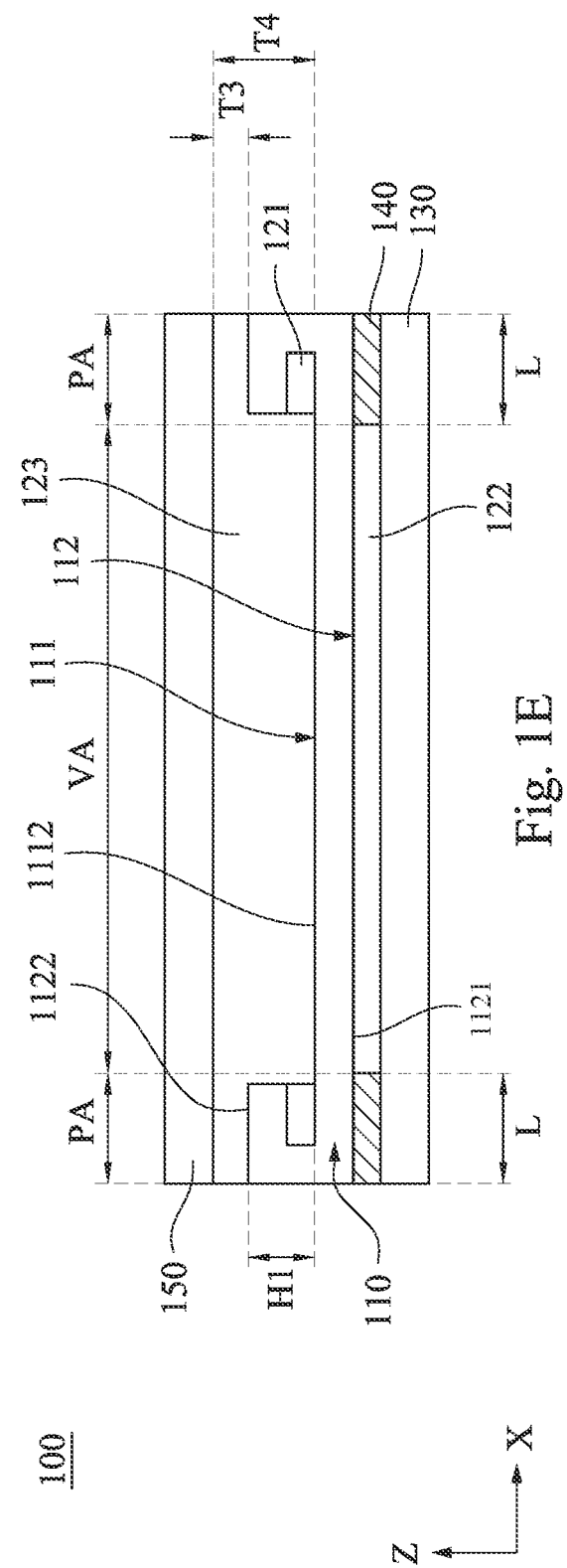

Next, with reference to FIG. 1E, the third adhesive layer 123 and the display module 150 are provided, and then, the third adhesive layer 123 is used to adhere the touch sensing film 110 and the display module 150 to obtain the touch display device 100. In the touch display device 100, the surface of the touch sensing film 110 adjacent to the cover plate 130 only has the second surface 112, and the surface of the touch sensing film 110 adjacent to the display module 150 has both of a portion 1112 of the first surface 111 and the other portion 1122 of the second surface 112. The distance between the portion 1112 of the first surface 111 and the other portion 1122 of the second surface 112 along the second direction (such as, the Z-axis direction) defines a height difference H1 (i.e., the thickness obtained by subtracting T1 from T2, also referring to FIG. 1D). That is, if a gap between the touch sensing film 110 and the display module 150 is filled with the third adhesive layer 123, the distance of the third adhesive layer 123 coated on the non-overlapping region NOR along the second direction (such as, the Z-axis direction) defines a thickness T4. The distance of the third adhesive layer 123 coated on the overlapping region OR along the second direction (such as, the Z-axis direction) defines a thickness T3. The thickness T4 is greater than the thickness T3. In some embodiments, the thickness T4 of the third adhesive layer 123 is greater than or equal to twice the thickness of the first adhesive layer 121 and less than or equal to five times the thickness of the first adhesive layer 121, i.e., 2 (thickness T1 which is twice the thickness T2)≤T4≤5 (T2−2T1). If the thickness T4 is less than this range, the thickness T4 of the third adhesive layer 123 is insufficient to tightly adhere the display module 150 and the touch sensing film 110 in the presence of the height difference H1. That is, if the thickness T4 is less than this range, bubbles are prone to appear between the display module 150 and the third adhesive layer 123 or between the display module 150 and the portion 1122, and cause moisture to invade the touch sensing film 110, which causes a touch failure. If the thickness T4 is greater than this range, the overall thickness of the touch display device 100 is too large, which runs counter to the development trend of the touch display module of becoming lighter and thinner.

In some embodiments, the third adhesive layer 123 is made of a light-transmitting material to avoid affecting the visual presentation of the visible area VA. A person skilled in the art can flexibly select and adjust the material and thickness of the third adhesive layer 123 according to the purpose of use, such as, a light-transmitting material and thickness the same as or similar to those of the second adhesive layer 122.

It should be emphasized that, in some embodiments of the present disclosure, by using the design of bending the touch sensing film 110, the length of the touch sensing film 110 in the peripheral area PA can be reduced without affecting the design of the electrode wires. Accordingly, the design of a narrow bezel or even a bezel-free touch display device is realized. Furthermore, using the bending design to fold a part of the touch sensing film 110 in the touch display device 100 can also prevent the outer electrode wires of the touch sensing film 110 from being exposed, providing more complete protection for the touch sensing film 110 and prolonging the service life of the touch display device 100.

In some embodiments, the display module 150 may include a light-guiding plate. The light-guiding plate is disposed on the touch sensing film 110. In some other embodiments, the display module 150 can be replaced with a backlight module, such as an Organic Light-Emitting Diode (OLED).

In other implementations, a person skilled in the art can also flexibly exchange, delete, or add other elements or steps according to actual needs.

For example, with reference to FIG. 2A to FIG. 2D, FIG. 2A to FIG. 2D are schematic cross-sectional views depicting various process stages of manufacturing a touch display device 200 in some embodiments according to the present disclosure.

In FIG. 2A to FIG. 2D, materials and parameter features the same as or similar to those in FIG. 1A to FIG. 1E can be used. The touch sensing film 210 may correspond to the touch sensing film 110, the first adhesive layer 221 may correspond to the first adhesive layer 121, the second adhesive layer 222 may correspond to the second adhesive layer 122, the third adhesive layer 223 may correspond to the third adhesive layer 123, the cover plate 230 may correspond to the cover plate 130, the light-shielding layer 240 may correspond to the light-shielding layer 140, and the display module 250 may correspond to the display module 150.

Figure 2A:
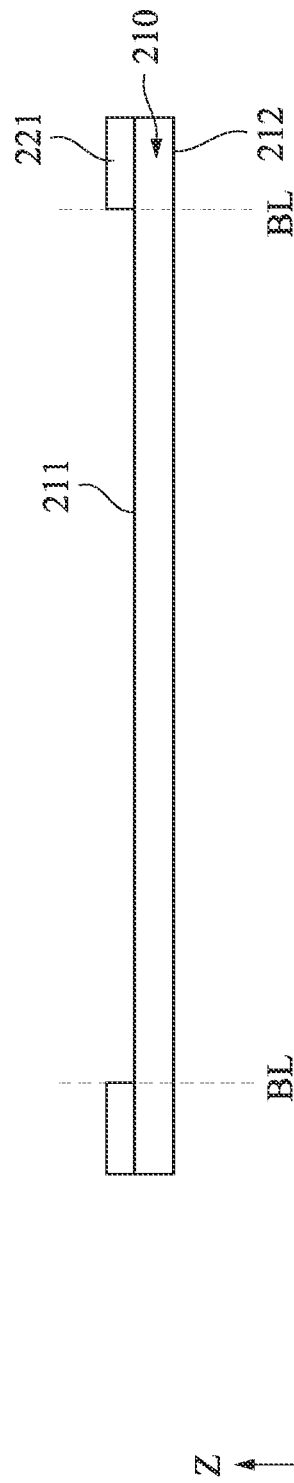
Figure 2B:
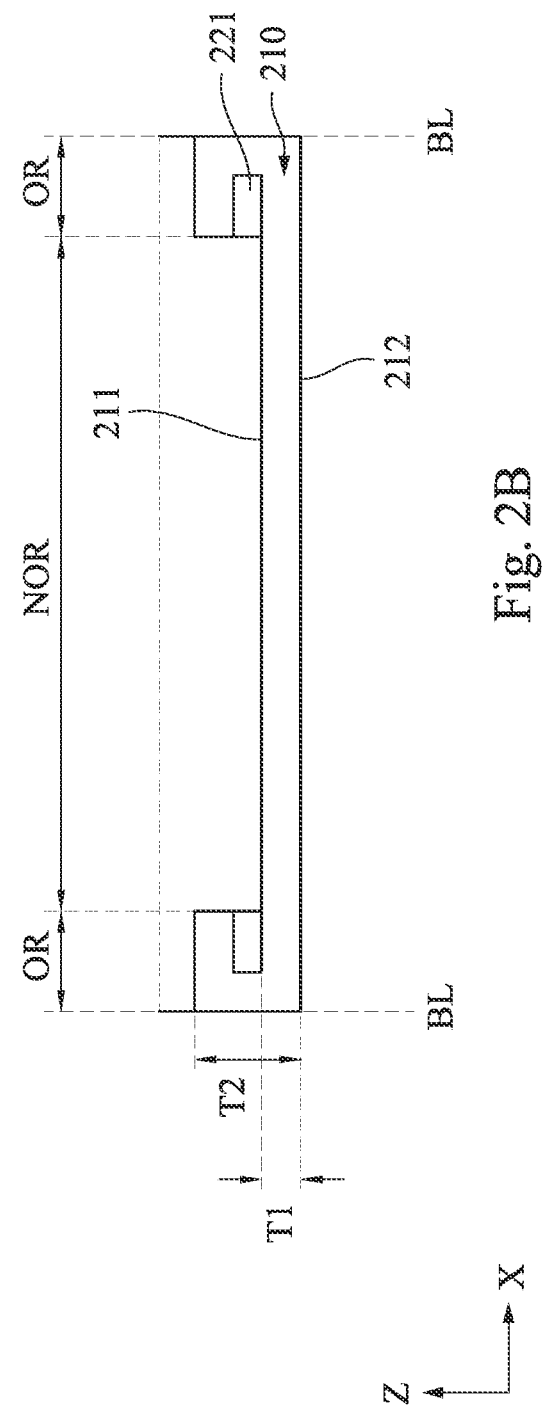

FIG. 2A to FIG. 2D differ from FIG. 1A to FIG. 1E in that: in FIG. 2A to FIG. 2B, the second surface 212 of the touch sensing film 210 is first bent upwards from two opposite sides from outside to inside, so that the first adhesive layer 221 adheres overlapping portions of the first surface 211 to define an overlapping region OR in the touch sensing film 210. Next, in FIG. 2B to FIG. 2C, the second adhesive layer 222 is used to adhere the bent second surface 212 of the touch sensing film 210 to the cover plate 230.

In FIG. 2C to FIG. 2D, steps that are the same as those in FIG. 1D to FIG. 1E are adopted, and the third adhesive layer 223 is used to adhere the display module 250 and the touch sensing film 210 to obtain the touch display device 200, which is the same as the touch display device 100. Moreover, in FIG. 2C and FIG. 2D, in some embodiments, in addition to adhering the cover plate 230 and the touch sensing film 210, the second adhesive layer 222 may further extend between the light-shielding layer 240 and the touch sensing film 210 to adhere the light-shielding layer 240 and the touch sensing film 210. That is, the second adhesive layer 222 is also disposed between the light-shielding layer 240 and the touch sensing film 210. In this case, the second adhesive layer 222 can make the adhesion between the light-shielding layer 240 and the touch sensing film 210 tighter, and the second adhesive layer 222 can also make the interface between the second adhesive layer 222 and the touch sensing film 210 less likely to generate bubbles.

In the embodiments of FIG. 2C to FIG. 2D, the thickness of the first adhesive layer 221 (i.e., referring to the thickness defined by T2−2T1 in FIG. 1D) and the thickness of the third adhesive layer 223 (i.e., thickness T4) also have the following relational expression: the thickness of the first adhesive layer 221 is greater than or equal to 50 μm and less than or equal to 100 μm, such as 50 μm, 60 μm, 70 μm, 80 μm, 90 μm, 100 μm, or the value of any of the foregoing intervals. In addition, the thickness T4 is greater than or equal to twice the thickness of the first adhesive layer 221 and less than or equal to five times the thickness of the first adhesive layer 221. The reason for setting the thickness ranges of the first adhesive layer 221 and the third adhesive layer 223 is the same as that in the foregoing description of FIG. 1D and FIG. 1E (the thickness relation between the first adhesive layer 121 and the third adhesive layer 123).

Figure 3:
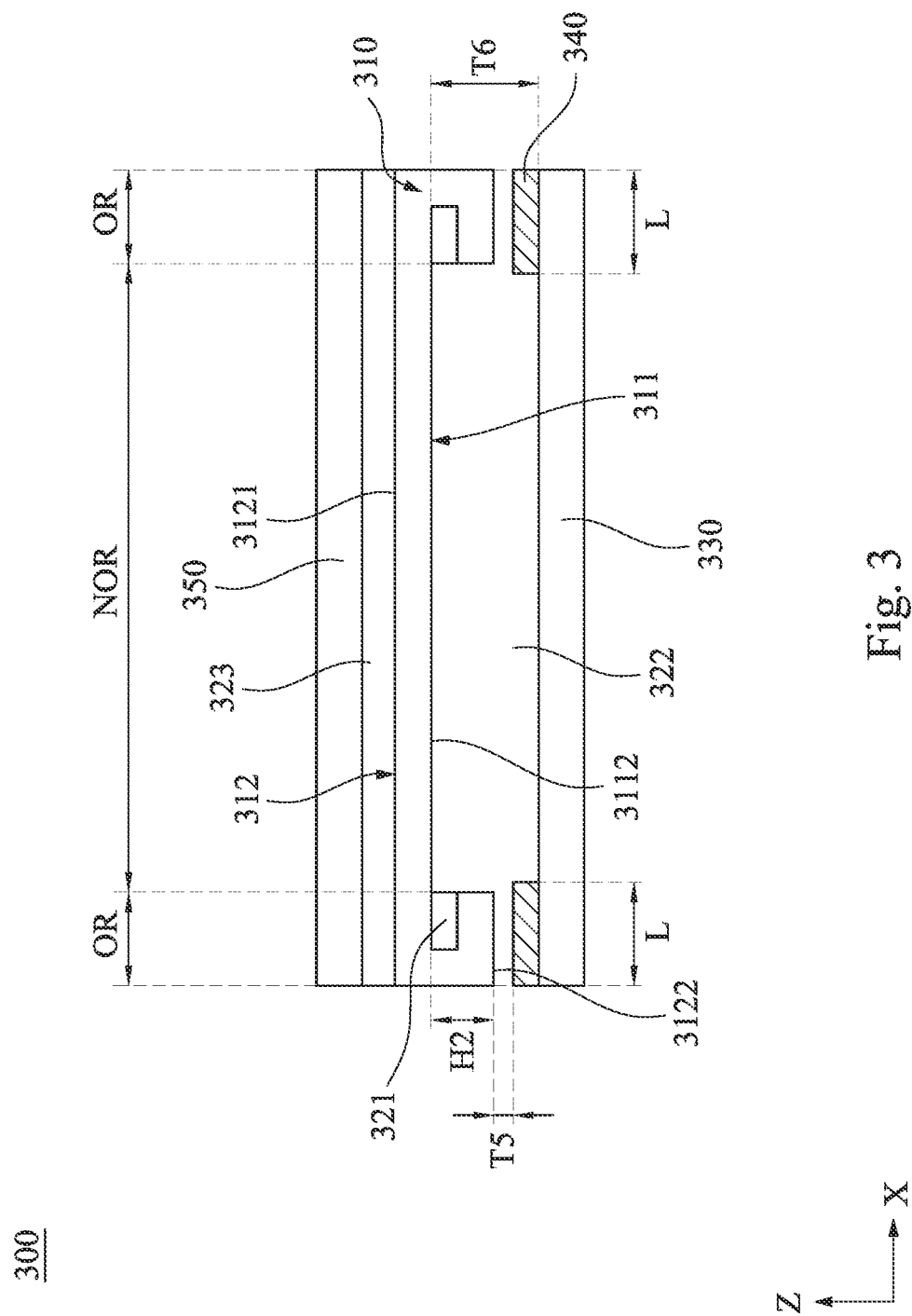
FIG. 3 is a schematic cross-sectional view exemplarily depicting a touch display device in some other embodiments according to the present disclosure.

FIG. 3 is a schematic cross-sectional view illustrating another aspect of the present disclosure and exemplarily depicting a touch display device 300 according to some other embodiments of the present disclosure. FIG. 3 differs from FIG. 1E and FIG. 2D in that: in the touch sensing film 310, the folded portion 3122 of the second surface 312 is adjacent to the light-shielding layer 340.

The touch display device 300 in FIG. 3 may use materials and parameter features the same as or similar to those in FIG. 1A to FIG. 1E and achieve the same or similar effects. The touch sensing film 310 may correspond to the touch sensing film 110, the first adhesive layer 321 may correspond to the first adhesive layer 121, the second adhesive layer 322 may correspond to the second adhesive layer 122, the third adhesive layer 323 may correspond to the third adhesive layer 123, the cover plate 330 may correspond to the cover plate 130, the light-shielding layer 340 may correspond to the light-shielding layer 140, and the display module 350 may correspond to the display module 150.

An approach of manufacturing the touch display device 300 is substantially the same as that of the touch display devices 100 and 200, and the difference is that the second surface 312 of the touch sensing film 310 is bent upwards from two opposite sides from outside to inside, so that the first adhesive layer 321 adheres overlapping portions of the first surface 311. Next, the adhered touch sensing film 310 is turned upside down, and then the second adhesive layer 322 is respectively used to adhere the portion 3122 of the folded second surface 312 and the light-shielding layer 340 and also adhere the cover plate 330 and a non-overlapping portion of the first surface 311. The third adhesive layer 323 is also used to adhere an unfolded portion 3121 of the second surface 312 of the touch sensing film 310 and the display module 350 to obtain the touch display device 300 as shown in FIG. 3.

In the touch display device 300, the touch sensing film 310 is bent from two opposite sides from outside to inside, so that the first surface 311 is folded. Along the second direction (such as, a Z-axis direction), except for the unfolded portion 3121 of the second surface 312 in an overlapping region OR, the other portion 3122 of the second surface 312 is folded to the top and is adhered by using the second adhesive layer 322 to define the overlapping region OR and a non-overlapping region NOR. The surface of the touch display device 300 adjacent to the display module 350 has only the second surface 312, and the surface of the touch sensing film 310 adjacent to the cover plate 330 has both of a portion 3112 of the first surface 311 and the other portion 3122 of the second surface 312; the distance between the portion 3112 of the first surface 311 and the other portion 3122 of the second surface 312 along the second direction (such as, a Z-axis direction) defines a height difference H2 (i.e., T3−T4). That is, if gaps between the touch sensing film 310 and the light-shielding layer 340 as well as the cover plate 330 are filled with the second adhesive layer 322, a thickness T6 defined by the distance of the second adhesive layer 322 coated under the non-overlapping region NOR along the second direction (such as, a Z-axis direction) is greater than a thickness T5 defined by the distance of the second adhesive layer 322 on the overlapping region OR along the second direction (such as, a Z-axis direction).

In the embodiment of FIG. 3, the thickness of the first adhesive layer 321 and the thickness of the second adhesive layer 322 (Le., the thickness T6) also have the following relational expression: the thickness of the first adhesive layer 321 is greater than or equal to 50 μm and less than or equal to 100 μm, such as 50 μm, 60 μm, 70 μm, 80 μm, 90 μm, 100 μm, or the value of any of the foregoing intervals. In addition, the thickness T6 is greater than or equal to twice the thickness of the first adhesive layer 321 and less than or equal to five times the thickness of the first adhesive layer 321. The reason for setting the thickness ranges of the first adhesive layer 321 and the second adhesive layer 322 is the same as the foregoing description of FIG. 2C to FIG. 2D (the thickness relation between the first adhesive layer 221 and the third adhesive layer 223) and FIG. 1D to FIG. 1E (the thickness relation between the first adhesive layer 121 and the third adhesive layer 123).

In some embodiments, the touch display device provided in the present disclosure may be further assembled with other electronic elements to form an electronic device, including, but not limited to, a mobile device (a mobile phone, a tablet, or a laptop), a wearable device (a smart watch, smart glasses, smart clothes, or smart shoes), or a vehicle device (an instrument panel, a driving recorder, a rearview mirror, a vehicle window, or a vehicle door).

In conclusion, the touch display device provided in some embodiments of the present disclosure utilizes the touch sensing film that is folded from outside to inside to reduce the length of the peripheral area, thereby reducing the bezel of the touch display device to realize no bezel or narrow bezel. In addition, the folding design of the touch sensing film also allows electrode wires to be all received inside the device, which can prevent the electrode wires from being exposed to the outside, thereby protecting the electrode wires, improving the durability of the touch display device, and prolonging the service life.

Although the present disclosure has been described in considerable detail with reference to certain embodiments thereof, other embodiments are possible. Therefore, the spirit and scope of the appended claims should not be limited to the description of the embodiments contained herein.

What is claimed is:

1. A touch display device, comprising:
   a cover plate;
   a touch sensing film disposed on the cover plate, wherein:
   the touch sensing film comprises a first surface and a second surface opposite to the first surface,
   a direction between two opposite ends of the touch sensing film is defined as a first direction,
   a direction passing through the first surface and the second surface is defined as a second direction,
   the second direction is perpendicular to the first direction,
   the two opposite ends of the touch sensing film are bent from outside to inside, so that the first surface or the second surface is folded to define an overlapping region and a non-overlapping region,
   a distance between the first surface and the second surface in the non-overlapping region of the touch sensing film along the second direction defines a first thickness,
   the first thickness is T1,
   a distance between the overlapped second surface in the overlapping region along the second direction defines a second thickness,
   the second thickness is T2,
   T1 is from 0.025 mm to 0.075 mm, and
   T2 is from 0.1 mm to 0.2 mm;
   a display module disposed on the touch sensing film;
   a first adhesive layer that adheres the first surface folded in the overlapping region, wherein a thickness of the first adhesive layer is 50 μm to 100 μm;
   a second adhesive layer that adheres the cover plate and the touch sensing film; and
   a third adhesive layer that adheres the touch sensing film and the display module, wherein a thickness of the third adhesive layer is greater than or equal to twice the thickness of the first adhesive layer and less than or equal to five times the thickness of the first adhesive layer.

2. The touch display device of claim 1, wherein the second adhesive layer adheres a light-shielding layer and the touch sensing film.

3. The touch display device of claim 1, wherein:
a light-shielding layer is disposed between the cover plate and the touch sensing film,
a majority of the light-shielding layer is located in the overlapping region, and
a length of the light-shielding layer along the first direction is greater than a length of the overlapping region along the first direction so that a portion of the light-shielding layer is located in the non-overlapping region.

4. The touch display device of claim 3, wherein:
the length of the light-shielding layer along the first direction is L, and
L is from 1 mm to 2.5 mm.

5. The touch display device of claim 1, wherein:
a surface of the touch sensing film adjacent to the cover plate has only the second surface,
a surface of the touch sensing film adjacent to the display module has both of a portion of the first surface and a portion of the second surface,
a distance between the portion of the first surface and the portion of the second surface along the second direction defines a height difference that is H1, and
H1 is greater than 0.

6. The touch display device of claim 1, wherein:
a surface of the touch sensing film adjacent to the display module has only the second surface,
a surface of the touch sensing film adjacent to the cover plate has both of a portion of the first surface and a portion of the second surface,
a distance between the portion of the first surface and the portion of the second surface along the second direction defines a height difference that is H2, and
H2 is greater than 0.

7. The touch display device of claim 1, wherein projection positions of the second adhesive layer and the first adhesive layer on the touch sensing film along the second direction do not overlap.

8. The touch display device of claim 1, wherein projection positions of the second adhesive layer and the first adhesive layer on the touch sensing film along the second direction partially overlap.

9. The touch display device of claim 1, wherein the second adhesive layer is coated on the second surface of the touch sensing film that overlaps the cover plate.

10. The touch display device of claim 1, wherein a transmittance of the second adhesive layer and the third adhesive layer to visible light is at least 60%.

11. The touch display device of claim 1, wherein:
the display module comprises a light-guiding plate, and
the light-guiding plate is disposed on the touch sensing film.

12. An electronic device, comprising the touch display device of claim 1.

13. A touch display device, comprising:
a cover plate;
a touch sensing film disposed on the cover plate, wherein:
the touch sensing film comprises a first surface and a second surface opposite to the first surface,
a direction between two opposite ends of the touch sensing film is defined as a first direction,
a direction passing through the first surface and the second surface is defined as a second direction,
the second direction is perpendicular to the first direction, and
the two opposite ends of the touch sensing film are bent from outside to inside, so that the first surface or the second surface is folded to define an overlapping region and a non-overlapping region;
a display module disposed on the touch sensing film, wherein:
a surface of the touch sensing film adjacent to the cover plate has only the second surface,
a surface of the touch sensing film adjacent to the display module has both of a portion of the first surface and a portion of the second surface,
a distance between the portion of the first surface and the portion of the second surface along the second direction defines a height difference that is H1, and
H1 is greater than 0;
a first adhesive layer that adheres the first surface folded in the overlapping region, wherein a thickness of the first adhesive layer is 50 µm to 100 µm;
a second adhesive layer that adheres the cover plate and the touch sensing film; and
a third adhesive layer that adheres the touch sensing film and the display module, wherein a thickness of the third adhesive layer is greater than or equal to twice the thickness of the first adhesive layer and less than or equal to five times the thickness of the first adhesive layer.

14. The touch display device of claim 13, wherein the second adhesive layer adheres a light-shielding layer and the touch sensing film.

15. The touch display device of claim 13, wherein projection positions of the second adhesive layer and the first adhesive layer on the touch sensing film along the second direction do not overlap.

16. The touch display device of claim 13, wherein a transmittance of the second adhesive layer and the third adhesive layer to visible light is at least 60%.

17. The touch display device of claim 13, wherein:
the display module comprises a light-guiding plate, and
the light-guiding plate is disposed on the touch sensing film.

18. A touch display device, comprising:
a cover plate;
a touch sensing film disposed on the cover plate, wherein:
the touch sensing film comprises a first surface and a second surface opposite to the first surface,
a direction between two opposite ends of the touch sensing film is defined as a first direction,
a direction passing through the first surface and the second surface is defined as a second direction,
the second direction is perpendicular to the first direction, and
the two opposite ends of the touch sensing film are bent from outside to inside, so that the first surface or the second surface is folded to define an overlapping region and a non-overlapping region;
a display module disposed on the touch sensing film, wherein:
a surface of the touch sensing film adjacent to the display module has only the second surface,
a surface of the touch sensing film adjacent to the cover plate has both of a portion of the first surface and a portion of the second surface,
a distance between the portion of the first surface and the portion of the second surface along the second direction defines a height difference that is H2, and H2 is greater than 0;
a first adhesive layer that adheres the first surface folded in the overlapping region, wherein a thickness of the first adhesive layer is 50 μm to 100 μm;
a second adhesive layer that adheres the cover plate and the touch sensing film; and
a third adhesive layer that adheres the touch sensing film and the display module, wherein a thickness of the third adhesive layer is greater than or equal to twice the thickness of the first adhesive layer and less than or equal to five times the thickness of the first adhesive layer.

19. The touch display device of claim 18, wherein projection positions of the second adhesive layer and the first adhesive layer on the touch sensing film along the second direction do not overlap.

20. The touch display device of claim 18, wherein:
the display module comprises a light-guiding plate, and the light-guiding plate is disposed on the touch sensing film.

* * * * *